United States Patent
Camarota

(10) Patent No.: US 6,874,110 B1
(45) Date of Patent: Mar. 29, 2005

(54) APPARATUS AND METHOD FOR SELF TESTING PROGRAMMABLE LOGIC ARRAYS

(75) Inventor: Rafel C. Camarota, Sunnvale, CA (US)

(73) Assignee: Stretch, Inc., Mountain View, CA (US)

(*) Notice: Subject to any disclaimer, the term of this patent is extended or adjusted under 35 U.S.C. 154(b) by 0 days.

(21) Appl. No.: 09/569,741

(22) Filed: May 11, 2000

(51) Int. Cl.$^7$ .................. G01R 31/28; G06F 11/00
(52) U.S. Cl. .................................. 714/733; 714/735
(58) Field of Search .................. 714/725, 735, 714/736, 733, 734, 742, 718, 719, 819, 824, 724; 365/200, 201

(56) References Cited

U.S. PATENT DOCUMENTS

| | | | |
|---|---|---|---|
| 4,635,261 A | * | 1/1987 | Anderson et al. ........... 714/732 |
| 4,672,610 A | | 6/1987 | Salick |
| 4,766,569 A | * | 8/1988 | Turner et al. .......... 365/185.11 |
| 4,768,196 A | | 8/1988 | Jou et al. |
| 4,893,311 A | * | 1/1990 | Hunter et al. ................ 714/733 |
| 5,488,612 A | * | 1/1996 | Heybruck ................... 714/725 |
| 5,784,636 A | | 7/1998 | Rupp |
| 5,982,681 A | * | 11/1999 | Schwarz ..................... 365/201 |
| 5,987,632 A | * | 11/1999 | Irrinki et al. ............... 714/711 |
| 5,991,907 A | | 11/1999 | Stroud et al. |
| 6,108,252 A | * | 8/2000 | Park .......................... 365/201 |
| 6,119,251 A | * | 9/2000 | Cloud et al. ................ 714/718 |
| 6,260,182 B1 | | 7/2001 | Mohan et al. |
| 6,343,366 B1 | * | 1/2002 | Okitaka ...................... 714/733 |
| 6,438,722 B1 | * | 8/2002 | Bailey et al. ............... 714/736 |

OTHER PUBLICATIONS

M. Morris Mano, "computer System Architecture", $2^{nd}$ Edition, Prentice–Hall 1982, pp. 69–71.*

* cited by examiner

Primary Examiner—Christine T. Tu
(74) Attorney, Agent, or Firm—Carr & Ferrell LLP

(57) ABSTRACT

A self-testing programmable logic array PLA system has an array of programmably interconnected logic cells, a built-in self-test (BIST) structure interconnected with the logic cells, and a BIST engine having an initiation input. The system is characterized in that, upon receiving the initiation input, the BIST engine drives the BIST structure to test connections and functions of the PLA. BIST systems are taught for stand-alone programmable logic arrays (PLAs) and for PLAs embedded in System-on-a-Chip (SoC) devices.

7 Claims, 3 Drawing Sheets

APPARATUS AND METHOD FOR SELF TESTING PROGRAMMABLE LOGIC ARRAYS

FIELD OF THE INVENTION

The present invention is in the area of testing functions of integrated circuits, and pertains more particularly to methods and apparatus for self-testing such circuits. The present invention is particularly applicable to testing programmable logic arrays (PLAs).

BACKGROUND OF THE INVENTION

Integrated Circuits are generally categorized by the functions they perform. Commonly, such devices can be categorized as either logic or memory devices; the logic devices performing logic functions and the memory devices principally devoted to storing values used in computing tasks.

Logic Devices are commonly subcategorized into fixed logic and programmable logic devices. Fixed Logic designs include microprocessors and similar devices which are not typically capable of being custom-configured by the end user. Programmable logic devices are a hybrid of logic and memory devices that allow the device user to program and store on the device an application-specific logic configuration. That is, by programming techniques a PLA may be customized to perform specific functions repeatedly.

In many cases, desired device functionality strongly influences the device circuitry design, the process used to manufacture the device, the packaging method used to contain the device, and the methods used to test the device for proper function after manufacture. An increase in complexity of any integrated circuit leads to an increase in complexity of testing the device to ensure proper operation.

In the case of a fixed logic microprocessor device, it may contain on the chip elements of memory, logic, and a variety of peripheral circuits for communication to external circuits. All of these circuits must be tested for proper functional operation and operating speed.

While fixed logic devices are complex to test, the test protocol for such devices is somewhat simplified by the fact that they are always used in a consistent logic mode. Because the user has no ability to alter these devices to be application specific, the testing of the fixed logic and fixed memory size devices can be simplified relative to a device that can be configured (programmed) to a wide range of custom applications and runs a wide range of end-user programmed logic.

PLAs are integrated circuits that include an ability to program the logical operation of the device by storing a user defined program in the device. In addition to their uses as stand-alone devices, PLAs can be embedded into even larger, more complex circuits creating higher-level devices for many uses. A drawback of this approach is that testing such devices can be quite complicated, and therefore relatively expensive.

PLAs must be tested not only for basic circuit operation, but also tested in a variety of programmed conditions that simulate all of the possible programmed logic states that an end user could configure. This means a typical (conventional) PLA test includes a repeating sequence of: programming a standard logic condition into the device, testing the device with this logic configuration, and comparing the actual output to an expected output table. This sequence may be repeated a large number of times to fully test a device. Therefore, PLA architectures that offer the most flexibility to a user extract a proportionally higher price when it is required to test that all of the possibilities work.

Since PLAs are made in many capacities, an added complication is a need to create test programs and comparison data for each device capacity. Further, if PLAs are to be embedded within other, more complex circuits, such as System on a Chip (SoC) devices, it would be inconvenient and difficult to provide complete and isolated tester access to an embedded PLA in a more complex circuit. It is an object of the present invention to enable and facilitate SoC architectures having embedded PLAs, by providing significantly improved access to and testing of the PLA functionality in the larger integrated circuit. This access and testability is significantly enhanced by inclusion of a Built-In Self-Test (BIST) system according to embodiments of the present invention taught herein.

Given the above background, what is clearly needed is a simplified way to test both stand-alone and embedded PLAs more quickly and with less effort than has been provided in the prior art, and to therefore enable and enhance the placement of PLAs in larger integrated circuits, such as SoCs.

SUMMARY OF THE INVENTION

In a preferred embodiment of the present invention a self-testing programmable logic array (PLA) system is provided, comprising an array of programmably interconnected logic cells; a built-in self-test (BIST) structure interconnected with the logic cells; and a BIST engine having an initiation input. The system is characterized in that, upon receiving the initiation input, the BIST engine drives the BIST structure to test connections and functions of the PLA.

In some embodiments the BIST engine further comprises a test-result output which it drives selectively to indicate test pass or fail. Further, the BIST engine accomplishes memory tests, interconnect tests, and functional logic node tests. In performing tests in preferred embodiments of the invention like cells are programmed with identical patterns, and output vectors from like cells programmed with identical patterns are compared, wherein failure of outputs of like logic cells and interconnect to match indicates failure of one or more cells. Also in some embodiments the BIST structure comprises a group addressing function for programming multiple like logic cells simultaneously with an identical pattern, and a group compare function wherein outputs of like logic cells and interconnect are compared simultaneously.

In some cases the BIST engine comprises a microprocessor for driving tests, while in other cases the BIST engine is a state machine triggered by the initiation input. The BIST engine may be a part of the same IC structure as the PLA, or may be implemented separately from the PLA.

In another aspect of the present invention a system-on-a-chip (SoC) is provided, comprising multiple functional regions; and a self-testing programmable logic array PLA having an array of programmably interconnected logic cells, a built-in self-test (BIST) structure interconnected with the logic cells, and a BIST engine having an initiation input. The SoC is characterized in that, upon receiving the initiation input, the BIST engine drives the BIST structure to test connections and functions of the PLA.

In some embodiments the BIST engine further comprises a test-result output which it drives selectively to indicate test pass or fail, and in some embodiments the BIST engine accomplishes memory tests, interconnect tests, and functional logic node tests. Also in some cases like cells are programmed with identical patterns, and output vectors from like cells programmed with identical patterns are compared, wherein failure of outputs of like logic cells and interconnect to match indicates failure of one or more cells. In still other embodiments the BIST structure comprises a group addressing function for programming multiple like logic cells simultaneously with an identical pattern, and a group compare function wherein outputs of like logic cells and interconnect are compared simultaneously.

The BIST engine may comprise a microprocessor for driving tests, or it may be a state machine triggered by the initiation input. Further, the BIST engine may be a part of the same IC structure as the PLA, or may be implemented separately from the PLA.

In yet another embodiment of the invention a method for testing a programmable logic array (PLA) having an array of interconnected logic cells is provided, comprising the steps of (a) combining a built-in self-test BIST structure interconnected with the array of logic cells with programmable interconnect and functionality; (b) implementing a BIST engine having an initiation input coupled to the BIST structure on the same integrated circuit as the PLA; and (c) driving tests through the BIST structure by the BIST engine upon activating the initiation input.

In some embodiments of the method the BIST engine further comprises a test-result output, and comprising a step (d) for driving the output to indicate test pass or fail. Also in some embodiments the BIST engine accomplishes memory tests, interconnect tests, and functional logic node tests. Further, in some cases like cells are programmed with identical patterns, and output vectors from like cells programmed with identical patterns are compared, wherein failure of outputs of like logic cells and interconnect to match indicates failure of one or more cells. There may also be a group addressing function for programming multiple like logic cells simultaneously with an identical pattern, and a group compare function wherein outputs are compared simultaneously.

In some cases the BIST engine comprises a microprocessor for driving tests, and in other cases the BIST engine is a state machine triggered by the initiation input.

In still another aspect of the invention a method for testing a programmable logic array (PLA) having an array of logic cells with programmable interconnect and functionality implemented as a part of a system-on-a-chip (SoC) integrated circuit (IC) is provided, comprising the steps of (a) combining a built-in self-test BIST structure interconnected with the array of logic cells; (b) implementing a BIST engine having an initiation input coupled to the BIST structure on the same integrated circuit (IC) as the SoC; and (c) driving tests through the BIST structure by the BIST engine upon activating the initiation input.

In some cases of this method the BIST engine further comprises a test-result output, and comprising a step (d) for driving the output to indicate test pass or fail, and the BIST engine accomplishes memory tests, interconnect tests, and node tests. Also in some embodiments like cells are programmed with identical patterns, and output vectors from like cells programmed with identical patterns are compared, wherein failure of outputs to match indicates failure of one or more cells. The BIST structure may also comprise a group addressing function for programming multiple like logic cells simultaneously with an identical pattern, and a group compare function wherein outputs are compared simultaneously.

In some cases of this method the BIST engine comprises a microprocessor for driving tests, and in other cases the BIST engine is a state machine triggered by the initiation input.

In embodiments of the present invention taught in enabling detail below, for the first time a built-in self-test system is provided for testing logic circuitry quickly and efficiently, and in a manner applicable to testing PLAs and the like on system-on-a-chip devices.

DESCRIPTION OF THE PREFERRED EMBODIMENTS

The present invention in preferred embodiments is an enhancement to conventional integrated circuits which provides new ability in testing procedures, and overcomes many problems of conventional integrated circuit testing, producing simplified circuit testing, high throughput, and high quality. The inventor terms the new and unique capability a Built-In-Self-Test (BIST) system. A BIST system, as taught herein in enabling detail in embodiments of the invention, is applicable to stand-alone structures such as PLAs, and also to PLAs and other devices embedded in larger integrated circuits, such as SoC systems. It is an object of the invention to enable embedding of PLAs in larger integrated circuits, such as SoCs, by providing an apparatus and method allowing inexpensive and efficient testing of such circuits.

Figure 1A:
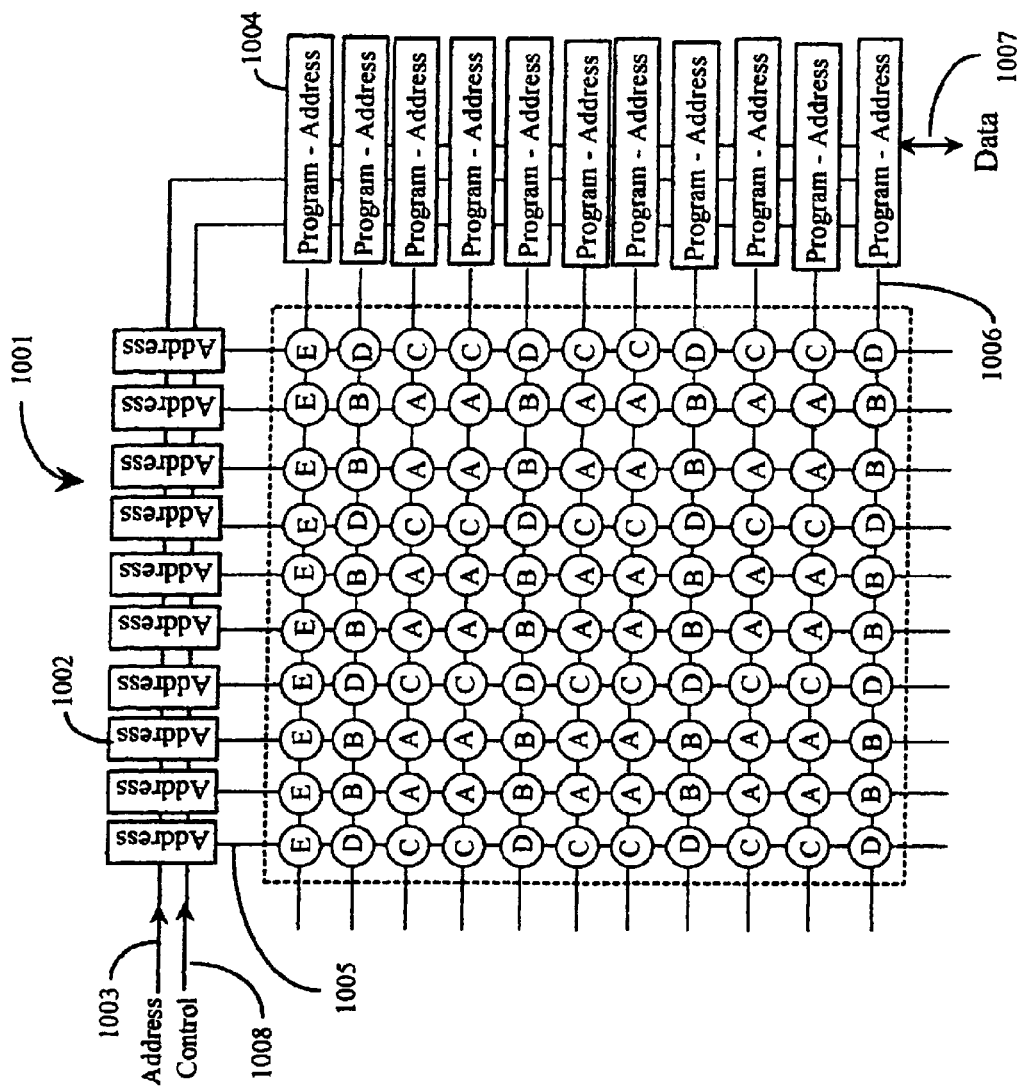
FIG. 1a is a block diagram of a Programmable Logic Array (PLA) according to the prior art.

FIG. 1a is a plan view diagram of an exemplary PLA 1001 in the current art at the time of filing the present patent application. A PLA is an array of logic cells configured to accomplish specific different functions. There are typically several of each of several types of cells in such an array. In FIG. 1a there are five cell types labeled A through E in the array.

Each cell in a PLA has one or more memory registers, and the PLA is capable of writing to and reading from the registers to perform the logic functions. Further, the cells may be interconnected by programming in various ways to structure specific dedicated tasks for the PLA.

There are in the exemplary structure of FIG. 1a a row of address decode blocks 1002 associated with each column of the array. These blocks are interconnected by an address bus 1003, and to each cell in each column by address lines 1005. A vertical column of program-address blocks 1004, also interconnected to address bus 1003 provides address decoding for rows in the array, and there are similarly address lines in lines 1006, along with bit lies interconnecting the cells in each row. The address decode circuitry in each block 1004 is also connected to address bus 1003.

Blocks 1004 have, in addition to the address decode circuitry, program circuitry for providing program functions, connected by control lines 1008, and there is a data bus 1007 interconnecting the column of program-address blocks 1004. The program circuitry is used to connect the bit lines in each row to the memory locations addressed by the address circuitry connected to the rows and columns. There are bit lines, as stated above, from program—address blocks 1004 in each row to each cell in the row.

Address, control, and data signals all come from external to the PLA, which, in the case of a stand-alone PLA may mean from off-chip, or, in the case of a PLA embedded in a bigger circuit, such as a SoC system, from elsewhere on the integrated SoC circuit. Typically memory locations in individual cells are enabled by addresses asserted on the address bus, and values are written to, or read from the memory addresses on the bit lines to the cells from the program-drive blocks from the data bus 1007. Importantly, PLAs at the time of this invention are implemented such that the address system enables access to one word at a time in the cells.

An end user can program a PLA to utilize different ones of the logic circuits in specific order to provide customized logic functions. An advantage of this approach is that a single PLA, manufactured in mass quantities, therefore taking advantage of cost reductions, can be utilized for a very broad range of customized functionality. One does not have to dedicate an application-specific circuit to each task. As discussed above in the Background section, such PLAs are difficult and expensive to test, and the present invention provides on-chip hardware and accompanying methods for reducing the complexity, time and cost of testing such circuits.

Figure 1B:
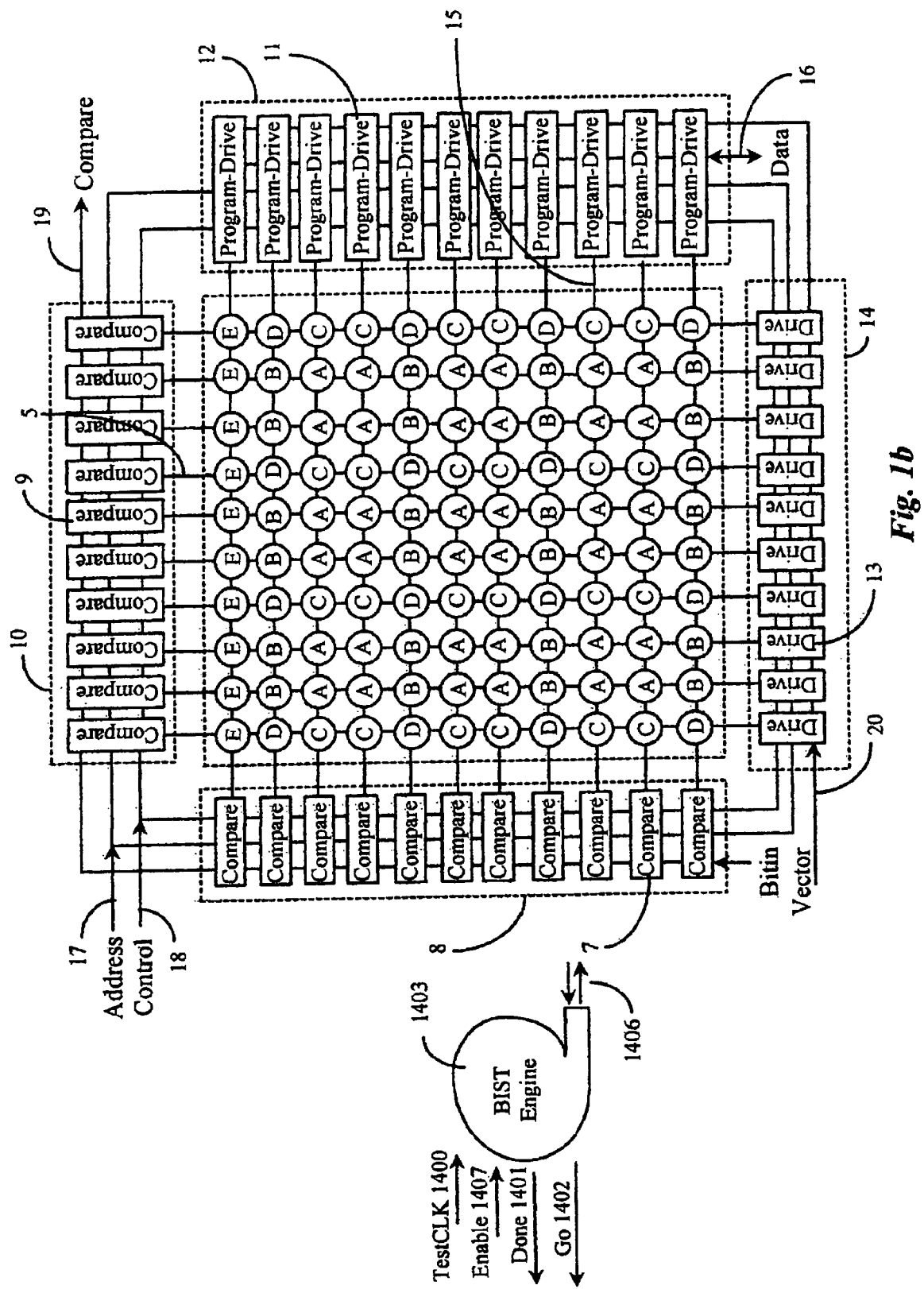
FIG. 1b is a block diagram of a PLA with a Built-In Self Test (BIST) system according to an embodiment of the present invention.

FIG. 1b is a block diagram of an exemplary Programmable Logic Array (PLA), such as the example of FIG. 1a, enhanced by a BIST system in an embodiment of the present invention. The PLA as shown in FIG. 1b comprises an array of specific types of logic circuits (cells) that provide specific logic functions, just as described for FIG. 1a. For example, in FIG. 1b, five different types of specific cells labeled A through E are shown in multiples instances. Cells of a single type, A for example, are cells that have the same transistor schematic, the same configuration memory, and the same local and global input values.

In the illustration of FIG. 1b, there are still address blocks for both rows and columns, as shown in FIG. 1a for a conventional PLA, but the address blocks are not shown in FIG. 1b, to avoid confusion.

Several structures are added for the exemplary BIST-enabled PLA illustrated in FIG. 1b over the structures of FIG. 1a to enable BIST functions. Among these structures are a set 10 of compare blocks 9 for each column of cells, and a set 8 of compare blocks 7 for each row of cells. There are additionally a set 12 of program-drive blocks 11 connected to rows in the array, and a set 14 of drive blocks 13 connected to the columns in the array.

The BIST system taught herein in is not designed for a specific programmable array architecture and will generally work with a broad range of architecture. In some embodiments the invention is particularly applicable to a class of PLAs known as an SRAM-based field-programmable gate arrays (FPGA), but other programmable logic types also benefit from the invention in various embodiments.

The array of logic structures illustrated in FIG. 1b is a regular pattern of various cell types A through E, as described above. It is not necessary that the array be homogeneous, and there may be a rich mix of differing cell types. In the exemplary array of FIG. 1b (A) cells are the primary logic cells, sometimes referred to in the art as core cells. The less common (B) and (C) cells are possibly routing control cells for example, and the even less common D cells might be global routing resources, for example. The E cells may be clock control structures or I/O interface blocks, for example. There are in the array more than a single instance of each cell type in each row and each column of the array, and this is typical. The present invention in a preferred embodiment takes advantage of this symmetry by instituting a novel compare functionality to test and verify the cells.

The PLA with BIST, according to a preferred embodiment of the invention as illustrated in FIG. 1b, has special configuration memory features allowing identical cells to be efficiently configured with the same memory pattern. Additional features allow global signals to be driven with useful patterns that repeat with a period matching the boundaries of the identical cells. The states of selected nodes in each identical cell create an output vector. The BIST-enabled PLA has features that allow the vector coming from each identical cell to be read and compared to other like cells, and in some cases to an input standard. Like cells are ones that have the same transistor schematic, the same configuration memory and the same local and global input values.

The BIST-enabled PLA has features that allow the output vectors from identical cells to be compared to each other. All output vectors for identical cells will be the same in a fully functional array. If, in self testing, it is discovered that one output vector does not match the others or one bit in one vector is different than others, a fault is declared. If enough combinations of configuration memory states and global inputs are tested, 100% fault coverage is achieved. The combinations chosen are for maximizing fault coverage, not for modeling some expected usage. The BIST system described allows symmetric control of identical cells and testing for identical results.

For the BIST system in embodiments of the present invention to be most effective, there needs to be multiple cell types in a row or column. In FIG. 1b there is a cell type E (element 5), which represents, for example, a clock control structure or IO interface block in an actual array. The E cell has only one instance in any given column, but there is a complete row of E cells. To test the E cells, then, a test structure and protocol which works on rows will be required. In some cases, however, a test structure and protocol that compares in columns will be needed. Therefore it is desirable that the structure and protocol exist and operate efficiently in both rows and columns, and this is a feature of preferred embodiments of the present invention. It is not required in all embodiments, however, that the structure allow testing in both rows and columns.

In the array of FIG. 1b there is no cell type which has only a singular placement or diagonal repetition, and in the preferred embodiment diagonal compare is not supported. This is because diagonal or unique cell placements are not common in programmable logic architectures. The method and apparatus for BIST, however, would still be applicable in alternative embodiments which could address such structures.

The array of FIG. 1b is made up of multiples of different cell types labeled A–E, as described above. Underlying vertical lines 5 and horizontal lines 15 are not single physical lines, but represent interconnection paths carrying various signals necessary to both the functioning of the PGA and operation of the BIST system. Therefore each horizontal line 15 represents a collection of lines and signals running horizontally through rows of the array. These lines include BIT lines used to read or write the programmable logic array configuration control memory and address lines used in the address process required for configuration memory read and write. The horizontal lines also include global lines in some embodiments of the invention. Global lines are signal lines defined by the architecture which travel a distance longer then one core cell pitch and ideally extend the complete length of the row of the programmable logic array. The global signal lines also may carry signals which come from external sources and travel from the edge to the core of the array.

In FIG. 1b representative lines 15 extend in each row to a compare block 7 on the left, and a program-drive Block 11 on the right. The compare block in each row in a preferred embodiment connects to a BIT line and Address subset of horizontal lines 15 in the same row. The program portion of the program-drive block in the same row connects to the BIT and address lines in the same row also. The Drive portion of the program-drive block is connected to global lines to drive them as needed by the BIST system.

The horizontal compare blocks 7 form a set 8 of horizontal compare blocks which have some common signal lines extending to all compare blocks, including a set, 10 of vertical compare blocks 9. These are representative interconnection lines labeled Compare 19, Address 17, and Control 18.

The Compare signal is a cascading signal which tracks matching of the signal going into the compare blocks from the array. The Address signals are system-level configuration memory word selection signals. These are used to generate horizontal and vertical addresses on the address lines in interconnections 15 and 5. The Address lines are also used to control the compare function such that only like cell types are compared at any one time.

Control signals 18 are a collection of signals which generally enable certain modes of operation as desired. The program-drive block-shares Address interconnection and signals 17 and Control interconnection and signals 18, data 16 and vector 20. The program-drive block also has interconnects and signals for data 16 and vector interconnects and signals 20.

Data lines 16 comprise a data bus used as a source or destination for the configuration memory read and write operations. Vector bus 20 is used as a signal source for a global line drive circuit.

The interconnection and functionality of columns of cells and structures is similar to the description above for horizontal structures. Vertical lines 5 represent interconnections carrying signals of various types. These include address lines used in the address process required for configuration memory read and write. The vertical lines also comprise global user lines. Global user lines carry signals defined by the architecture which travel a distance longer then one core cell pitch but are primarily signals which extend the complete length (or height) of the programmable logic array. The global signals also comprise signals which come from external sources and travel from the edge to the core of the array.

In FIG. 1b lines 5 extend in each column to a compare block 9 on the top and a drive block 13 on the bottom of the array. The compare block 9 connects to the global lines and address lines subset of lines 15. The drive blocks are connected to the global lines to drive them as needed by the BIST system. The set 10 of vertical compare blocks 9 has some common signals running through to all compare cells, as described above. These lines that carry these common signals are Compare 19, Address 17, and Control 18, as also described above with reference to the set 8 of horizontal compare blocks. The Compare, again, is a cascading signal which tracks the matching of the signal going into the compare block from the array. The Address lines carry the system-level configuration memory word selection signals. These are used to generate horizontal and vertical address signals in lines 15 and 5. They are also used to control the compare function such that only like cells are compared to one another. The control lines are a collection of signals which generally enable certain modes of operation as desired, as previously stated. As described above for the horizontal lines, the drive blocks share Address interconnection and signals 17 and Control interconnection and signals 18, data 16 and vector 20. The drive blocks also have interconnects and signals for data bus 16 and vector interconnects and signals 20.

Referring again to FIG. 1b, every PLA implemented with a BIST system according to an embodiment of the present invention, whether embedded in a larger structure (SoC) or standalone, also has a BIST Engine 1403 preferably implemented on the same IC structure, but which may be implemented separately. The purpose of the BIST Engine is to orchestrate tests of the PLA as needed.

The BIST Engine may be implemented in a number of ways. For example, the BIST Engine in many preferred embodiments is a state machine, in other embodiments, particularly in SoC embodiments where there may be a microprocessor available, the BIST Engine may be implemented using functions of the microprocessor, and BIST Engine functionality may also, in some cases, be provided from an external machine such as a tester. There are advantages in differing circumstances for each sort of implementation.

Regardless of the implementation of the BIST Engine, the functions are essentially the same. Therefore the BIST engine is described herein as a state machine, and the skilled artisan will readily see how the same functionality may be provided in other implementations.

The BIST Engine is connected by bus 1406 to the I/O points of the PLA, being in general the Address, Control, Compare, Bitin, Vector, and Data buses and lines indicated in FIG. 1b. The Engine generates signals to control the BIST force and compare circuits and the FPGA configuration circuits as tests are conducted and results verified.

The BIST Engine has 2 external inputs TestCLK and ENABLE, 1400, and 1407 in a preferred embodiment. When ENABLE makes a Low to high transition the BIST Engine state machine generates signals which configure the PLA through output signals buses CONTROL and DATA from bus 1406. It also forces the DONE output signal, 1401, low and resets the GO output state 1402 to Low. It forces global line signals using VECTOR and FORCE signals in bus 1406.

The BIST Engine tests some expected results by driving the BITIN and other output signals in the 1406 bus. It then accumulates the COMPOUT results of each test through input signal COMPOUT, from the PLA under test, in bus 1406.

When the BIST engine state machine has completed all the tests in a BIST flow, described further below, the DONE output signal 1401 will be HIGH. Then the GO signal, 1402, will be a function of the accumulated COMPOUT from all the FPGA tests. If all bits of the COMPOUT word were one for all tests then the GO signal would be High indicating a fully functional FPGA. When the GO signal is low it indicates that the FPGA is bad because at least one bit in one of the COMPOUT words was low during the test flow. The GO signal becomes low whenever the failure occurs.

It is possible to monitor the GO signal continuously during test. By knowing at what TestCLK cycle GO goes low it is possible to know what circuit was being tested when it indicated a failure. It is also possible to make the GO signal an accumulator or register which represents a count of COMPOUT failures.

A very great advantage of the BIST system with a BIST Engine as taught herein, is that there is a very broad I/O interface in testing. In prior art testing of similar parts, there are typically a limited number of physical pins which must serve for all input and output to the device under test. In the BIST system according to embodiments of the invention taught herein, and equivalent systems, there is no such bottleneck, and tests may therefore be performed in fewer cycles. Another advantage is, that for embedded PLAs in bigger structures, there are no physical pins, but only on-chip interconnects (traces), and these traces are essentially impossible to use in making contact to I/O points to test the structure.

Referring again now to FIGS. 1a and 1b, there are a number of structures added in the unique implementation of FIG. 1b over the conventional implementation shown by FIG. 1a. The following text describes some of these additions:

Group Addressing. The CSRAM of the PLA in a preferred embodiment using a BIST system according to an embodiment of the present invention will be defined with an address system which allows unique addressing for normal configuration programming and which also allows groups of words to be written simultaneously with the same value. It is also possible to read the same group of words simultaneously for use with a compare system to verify that they all have the same value. This group addressing functionality in a preferred embodiment is not essential to BIST, but is a unique enhancement that greatly enhances the speed of testing.

Long Line Forcing. There are, in a preferred embodiment, X & Y circuits that are used to drive global long lines as required by the BIST system. Each line has a 3-state driver. The value on the driver is derived from the VECTOR bus directly. The Enable of these drivers is controlled by global FORCE[N] signals. The Global lines are appropriately grouped and controlled by respective FORCE lines.

Long Line output register. There is, in a preferred embodiment, an X & Y register at the opposite end of the PLA as the input Drivers. Each line has a capture latch. The shift register is fewer bits then the number of sampled signals. A decoding approach is used to allow all nodes to be captured. The Y lines use the normal CSRAM bit line latches. The X lines have a special capture latch for BIST compare.

Voting and Compare. A checking system is applied to the X long line output register, and the Y memory read/write bit register. It compares each respective bit of each active word on the X or Y edge. It has a positive result if and only if each active word is identical. The active word sets for compare are specified by the group addresses.

Diagnostic Read Bits. The Memory Data lines are connected, under the control of special read word lines, to specially chosen internal nodes, which allows sampling of internal nodes for increased fault coverage. This is not required, but helps to substantially reduce the number of test conditions required.

In operation the BIST system, through the BIST Engine, upon activation by the external control signal, conducts three kinds of tests: (1) memory tests, (2) long-line tests, and (3) internal logic node testing. These tests and test flow is described below.

CSRAM (Memory)Tests

The SRAM is tested with a series of walking 1 and walking 0 patterns. The data in memory is not actually verified, but confirmed with a voting system. The memory, in typical cases, is divided into sub blocks of memory. These blocks of bits, (actual size determined by physical PLA boundaries), is programmed identically over the full array with a walking 1 and walking 0 pattern. The cells are verified and the results compared to that of neighboring blocks. If all blocks match, then the SRAM bits are OK. If one or more block field is different the SRAM will be determined to be BAD. Since a simple XOR of the data allows double errors to be missed, a more complex compare system will be used which allows 1 to N−1 failures to be detected where N is the number of memory blocks in either dimension of the SRAM memory map. The memory block definition is defined such that the memory cells on the perimeter of the block are not physically adjacent to the memory cells on the perimeter of adjacent blocks. The compare system tests a subset of words chosen by the address decode system groups. The walking 1 and walking 0 patterns are verified to contain no invalid configuration combinations. Some configuration bit conditions to be avoided are:

More then one driver turned on to drive the same line
No driver turned on to drive a line
More then one path enabled in a multiplexer.
No paths enabled in a multiplexer.

The SRAM is also tested to verify that the power-up state is cleared, being all zeros. This is done by an initial block compare check. Any one state in the CSRAM after power-up would cause an error. The byte compare system has the ability to have an external standard word. In some cases, especially memory tests, the expected results are easy to predict. An initial compare word can be fed into the compare system. In such a case not only would all words in the PLA have to match each other but also they would have to match the external expected value. This prevents the false pass if all cells have a common failure.

Long Line Tests

Global long lines are verified for signal integrity and isolation. Global lines are defined as lines which span from one edge of the PLA to the other. The long line drivers are as weak as possible to allow parasitic paths to VSS or VCC to overwhelm then easily. They will be strong enough to allow the specified test cycle operation. The lines are tested for stuck-at-0 and stuck-at-1 faults first. Then walking one or zero patterns are used to check neighbor shorts. The walking pattern is based on the physical layout and not the architecture definition. Since the forcing and sense are on the extreme ends of the lines, continuity tests are done at the same time. The walking one/zero patterns are done in blocks with walking one/zero's spaced by some appropriate period to allow through testing and quick test time. The result values of the long line test is judged with the same type of compare system used in the CSRAM tests. The SRAM pattern during the long line tests is designed to not drive the lines. Global lines mean a different thing depending on the PLA architecture, but typically all PLA architectures have some global line structure that needs to be tested. Some architectures benefit by special structures that temporarily short lines which are less than global to create lines which go from edge to edge. This is most useful in cases where the architecture does not support such a programmable interconnect.

Internal Node Testing

The internal nodes of the PLA include logical Architecture nodes. They also include nodes in the memory and control circuits required to assure functionality. Other buried, non-architecture nodes are probed based on their ability to improve fault coverage with the fewest vectors. The number of internal probe points used is determined by fault coverage vs. die size impact. Fewer nodes means longer test time. Each test node requires an additional pass transistor to a CSRAM bit line. Each diagnostic node byte requires an additional address decode. The gates of the probe point transistors in one row are on the same diagnostic read word line. The row of diagnostic points has the same number of bits as a SRAM memory word.

During testing the array is typically sub-divided into blocks. The blocks have N inputs consisting of Global Long Lines, and configuration bits, and the outputs of other configured cells. The outputs are the diagnostic probe points, Memory bits, and the Global Long Line outputs. The same pattern of configuration bits are loaded into each cell of the same type. Long line inputs are grouped based on cell boundary and driven with the same pattern for each group with common usage. And then the diagnostic output pattern signature is read.

For each input combination the long line, memory, and diagnostic output bit signature are run through a compare similar to the CSRAM and long line tests compares. The compare system for the internal node test is slightly different then the memory and long lines compares, as not all cells in a row or column will match. Like cells need to be compared. The group addressing system defines the subset of cells to be compared. A cell needs to have at least 2 cells in a row or column for a compare to be made. Since it will be common for PLA architectures to have cells that are only one row or column deep the compare structures need to work in both the X axes and Y axes so that one-cell-wide structures in an architecture can be tested in the direction which allows 2 or more cells to compared at once. Architectures which have unique cells, or cells that are only used once cannot be tested, and therefore should be avoided in PLAs with BIST systems. Singular cells would require the compare system which allows cells to be compared to an external standard.

Consideration has been given to the use of global long lines as inputs or outputs based on a given configuration bit pattern. The Global Long Line control system needs to be able to subdivide the Global long lines to a cell type so that some are driven as inputs and some are read as outputs. The subdivision control which lines are driven. Passive reading can be done on all lines, but if a configuration of a cell under test drives a global line the global line drive would need to be disabled.

The number of input combinations needed to have full coverage of each block is part of the PLA development, but is known to be approximately 100 in most cases. It has been found that during the long line and SRAM tests a large proportion of the patterns are useful for internal node testing.

The BIST patterns resemble no usable PLA Program pattern. The goal is to achieve 99%+ stuck fault coverage for internal nodes.

Figure 2:
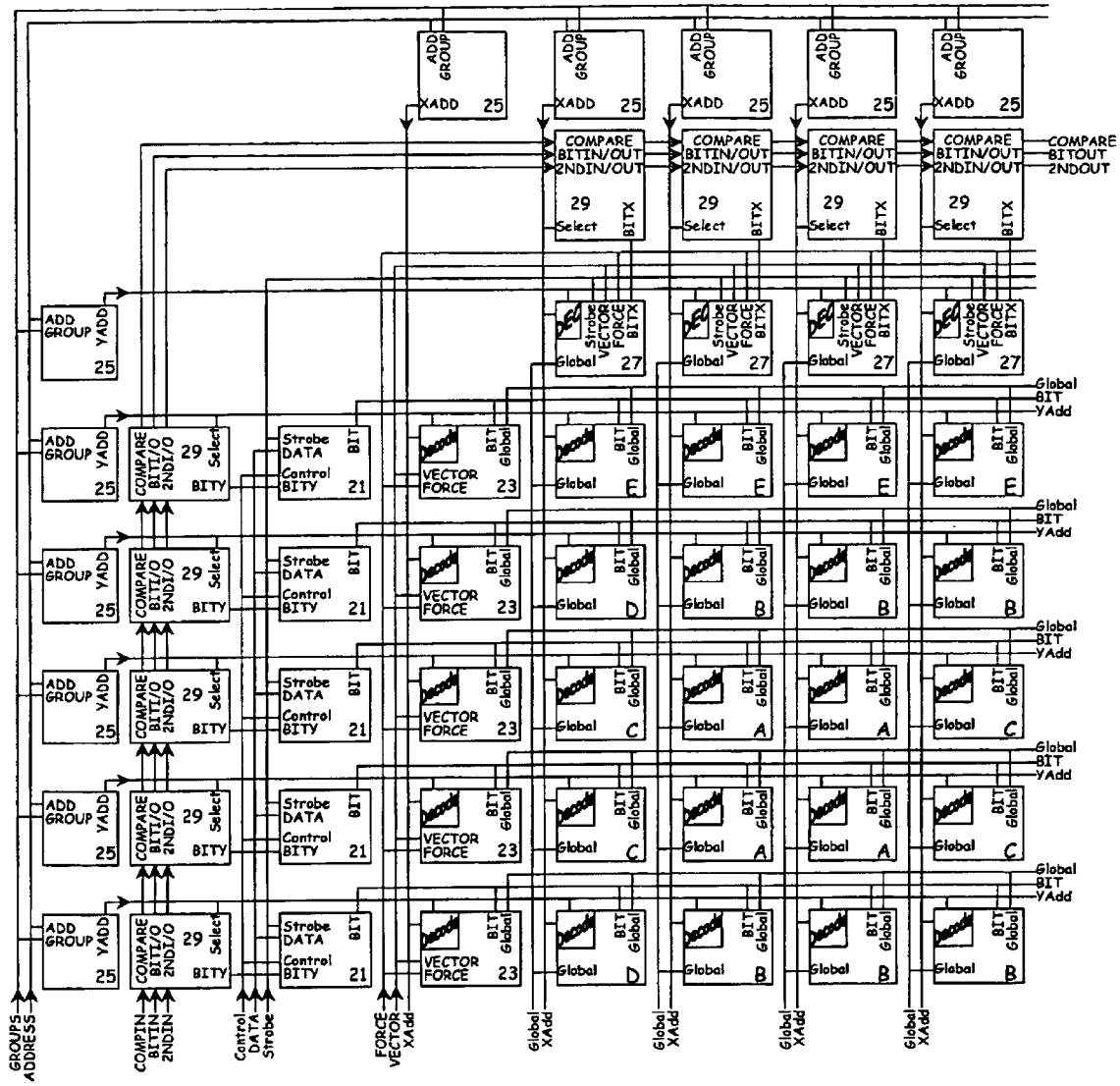
FIG. 2 is a schematic block diagram of a BIST system according to an alternative embodiment of the present invention.

FIG. 2 is a schematic diagram of a PLA with a complete built-in self-test system according to an alternative embodiment of the present invention. The system of FIG. 2 is functionally equivalent to the system shown as FIG. 1b, except more detail is shown in FIG. 2 than is shown in FIG. 1b. Also, only a portion of the logic array structures and BIST elements are shown in FIG. 2 to conserve space.

The BIST system shown in FIG. 2 is made up of various elements, some dedicated to BIST and some used in other operations. In going through the flow of Self Test the usage of elements from FIG. 2 is defined below, or alternative uses of elements is fully described.

Referring again to FIG. 2, There are signals running horizontally in the representative PLA described. BIT lines connect the function cell (A, B, C, D, E) memory data inputs to the Programming Logic in Element 21 of FIG. 2. They are also connected to Element 23. There are also Global lines which are wires used to connect function cells. The Global lines do have to go to all function cells, but in a pattern consistent with the goals of a given PLA architecture. All the Global lines also go to element 23. There are also horizontal running Y address lines. Each memory word is selected for program by a unique combination of Horizontal (Y), and vertical (X) address lines being active. The Y Address line signals are generated by an Element 25. The Y address lines go to Element 23 in the row and the local decode of all the memory word in the row. There are also additional Y address lines which go from elements 25 to the row of elements 27.

In addition to the above, there are many lines running vertically. There are, for example, vertical Global wires with the same character and function as the horizontal Global wires. They connect function cells and Elements 27. There are also X address lines running vertically with the same character as the horizontal Y address lines. The X address lines are driven by element 25 and go to elements 27, and all of the local decode elements. There are also X address lines which come from element 25 and go to the column of elements 23. There are vertical lines for Control which go to all Elements 21. These lines carry signals which control operations such as read, write, Dataen, Biten, precharge, and so forth. There is also a bus labeled DATA which goes to all elements 21. DATA is a bi-directional bus which receives data to be programmed into memory and sends values read from memory.

The next class of lines are those which go to both horizontal and vertically aligned elements. The first of these are the global Address lines which go to all elements 25, both vertically stacked and horizontally stacked. Working in conjunction with the address lines, there are group lines, which also go to all elements 25.

Strobe is a signal which goes to all elements 21 and 27. It is the clock to registers which temporarily store data to be used by the compare system. The FORCE bus is a collection of global line forcing control signals which drive all elements 27 and 23. The VECTOR Bus is the value forced onto selected global lines under the control of the FORCE signals. The VECTOR bus goes to all elements 27 and 23. There are also signals which are cascaded through elements of the BIST system. The COMPIN Bus, The BITIN Bus and the 2NDIN signal go into element 29 of the bottom row of the array. After a logical operation the signal is passed on to the next element 29, and so on, until element 29 of the top row. At this point the signals are passed on to the element 29 at the top of the first column. Then onto the next column element 29 until the element 29 in the last column generates output Bus COMPARE, output bus BITOUT, and output 2NDOUT. The final outputs are a function of the initial inputs COMPIN, BITIN, 2NDIN, and information local to each element 29, which the signals passed.

Compare Element 29 has a compare input word COMPIN, a compare output word COMPARE, a previous selected row bit line word in BITIN, and a current row bit line word in BITY. All these word are of the same width. The COMPARE output of one element 29 is connected to the next element 29 COMPIN, and the BITOUT is likewise connected to the BITIN. Element 29 has 2 control signals, 2NDIN and select. Element 29 generates a control signal 2NDOUT which is connected to the 2NDIN of the next element 29 cell. The following is the truth table for a compare element with a 3 bit COMPARE, COMPIN, BITIN, and BITY word width:

| Select | 2ND IN | COMPIN | | | BITIN | | | BITY | | | COMPARE | | | BITOUT | | | 2ND OUT |
|---|---|---|---|---|---|---|---|---|---|---|---|---|---|---|---|---|---|
| 0 | A | B | C | D | E | F | G | X | X | X | B | C | D | E | F | G | A |
| 1 | 0 | B | C | D | X | X | X | H | I | J | B | C | D | H | I | J | I |
| 1 | 1 | B | C | D | E | F | G | H | I | J | (ExH)*B | (FxI)*C | (GxJ)*D | H | I | J | I |

NOTE
x denotes the XNOR function

Element 29 either does nothing when not selected and just passes thru COMPIN data to COMPARE and BITIN data to BITOUT. When the element is selected but 2NDIN is 1, indicating that this is the first cell in the sequential compare, then the compare data is passed thru and the current BITY data is passed through to BITOUT for comparison in the next selected cell. When the element is selected and 2NDIN is 1, indicating that this is not the first cell in the sequential compare, the COMPARE output is a-bit-by-bit verification that a respective BITIN bit is equal to a BITY bit, and that the respective COMPIN bit is one. If either BITIN and BITY don't match or the COMPIN is a 0, the respective COMPARE output bit will be 0. Therefore the last COMPARE output value in the sequential compare indicates which bits of all words compared matched. A perfect match of all words compared would be a 1 in all bits of the COMPARE word. If the 2NDIN signal of the first element in the sequential compare is a 1 then the first selected BITY value will be compared to the BITIN value presented to the first element. This BITIN is described as a standard value. It allows the COMPARE value to indicate that all selected BITY values match each other, and an external "standard" value, BITIN.

Element 25 is the row or column address decode. The element has 2 inputs: an ADDRESS bus and a GROUP bus. When the GROUP bus is not active each binary value of the ADDRESS bus will result in a unique combination of local XADD and YADD lines being active. This will result in a unique configuration memory word at the intersection of the active XADD and YADD lines. Each element 25 generates an appropriate number of either XADD or YADD lines based on the number of configuration words needed by the PLA architecture in a given column or row. The GROUP bus value is designed to allow non unique or group addressing. Each GROUP value will result in a useful set of multiple XADD or YADD lines to be active at the same time. The number of group address values is determined by the requirements of the BIST flow. Each element 25 has the similar logic but has a unique decode of ADDRSS and GROUP busses.

Element 27 is the Vertical line sample and force control. Element 27 captures the values on vertically running PLA interconnect lines. The vertically running interconnect lines running in each column are divided into N words, each word having the same number of bits as the COMPARE bus word. There needs to be enough XADD and YADD lines going to elements 27 to decode N+1 different element operation modes. When not selected, the cell does nothing. When selected, one of the global interconnect words is passed thru to the BITX output, which goes to the BITY input of a sequential compare element. This makes it possible to sample the value of all vertically running global interconnect lines. Element 27 also has an input bus VECTOR which has the same number of bits as the COMPARE word. The VECTOR input can be passed thru to drive a set of vertically running global interconnect lines. The VECTOR to interconnect set connections correspond to the interconnect to BITX sets. Each VECTOR to interconnect set connection has a FORCE signal to enable it. There are N independent FORCE signals for N sets of global interconnect. Each FORCE signal enables the VECTOR bus to global interconnect set for all columns with identical global interconnect sets.

Based on the architecture there needs to be one FORCE signal for each type of global interconnect set. There is also a correlation between the force sets and the group addresses. There is a group address which reads all like global interconnect sets, for every FORCE signal which drives all like global interconnect sets. An important difference being that only one group of signals can be read at a time whereas multiple sets of global interconnect words can be driven with the same VECTOR value. This cell allows the PLA to have a maximum number of inputs and outputs during self test, independent of the number of embedded PLA input and output connections.

Element 23 is the horizontal line sample and force control. Element 23 transfers the values on horizontally running PLA interconnect lines to the bit lines for capture in element 21. The horizontally running interconnect lines running in each row are divided in to N words, each word having the same number of bits as the COMPARE bus word. There needs to be enough XADD and YADD lines going to elements 23 to decode N+1 different element operation modes. When not selected, the cell does nothing. When selected, one of the global interconnect words is passed thru to the BIT output which goes to the BIT input of a programming control element 21. This makes it possible to sample the value of all horizontally running global interconnect lines. Element 23 also has an input bus VECTOR which has the same number of bits as the COMPARE word. The VECTOR input can be passed thru to drive a set of horizontally running global interconnect lines. The VECTOR to interconnect sets correspond to the interconnect to BIT sets. Each VECTOR to interconnect set has a FORCE signal to enable it. There are N independent FORCE signals for N sets of global interconnect. Each FORCE signal enables the VECTOR bus to global interconnect set for all rows with identical global interconnect sets.

Based on the architecture there needs to be one FORCE signal for each type of global interconnect set. There is also a correlation between the force sets and the group addresses. There is a group address which reads all like global interconnect sets, for every FORCE signal which drives all like global interconnect sets. An important difference being that only one group of signals can be read at a time, whereas multiple sets of global interconnect words can be driven with the same VECTOR value. This cell allows the PLA to have a maximum number of inputs and outputs during self test, independent of the number of embedded PLA input and output connections.

Element 21 is the programming control element. Its function is to transfer data between the common DATA bus and the BIT bus on a given row. Based on the values of the CONTROL bus and the STROBE input the DATA value is driven onto the BIT bus during a configuration memory write; the BIT value is driven onto the DATA bus during a configuration memory read; the BIT value is transferred to the BITY output bus but not the DATA bus during a BIST compare. The STROBE signal is used to register the value read from the BIT bus, to make a sustainable output value on either the DATA or BITY outputs.

It is important to restate the general goal of a BIST system in embodiments of the present invention. The general goal is to test an integrated circuit to verify that all nets are connected as intended without opens or shorts to other nets. The goal also is to test that all active elements, primarily MOS transistors, have a high impedance state and a low impedance state as determined by the gate terminal. Any of these failures: an open, a short, or improper impedance control of a transistor can cause a stuck fault. A stuck fault states that a net will not go to the required logical state 0 or 1 because it has a conflicting path to the opposite state caused by a short, or a conflict caused by a transistor with an improper high impedance state.

It is also possible for a node on a net to be stuck because of an open in the net which isolates a node from the drive source of the net, or because there is no drive due to the improper operation of the low impedance state of a transistor responsible for driving the net. No matter what the cause the effect can be described as a net, or as a subset of nodes in a net, being stuck at a 1 or 0, which will result in a signature output failure. That is to say, if a series of sequential input vectors are presented to a device under test, and the resulting series of sequential output vectors are captured and compared to a standard set of vectors from a fully functional circuit, then the difference is caused by a net or a subset of nodes on a net being stuck at 1 or 0 in the device under test. A goal of a device test is to present enough sequential vectors that a stuck fault on any net in the device or any node in the device will result in at least one failure or mismatch in the output vector pattern. The number of sequential vectors to meet this requirement is a function of the number of nets and nodes in the device under test, the number of controllable inputs and the number of measurable outputs. Note that a failure on an output not measured by the test system is of no use in evaluating a device under test. Also an input which is not directly under the control of the test system can not be counted as a standard input, but is instead just another net or node to be verified for a stuck fault.

Vectors proportional to: (#net+#nodes)/
((#input+#output)/2)                    (Equation 1)

Equation 1 states that for a circuit of fixed size the number of vectors needed to test it is inversely proportional to the number of inputs and outputs such a test can use. This becomes a very critical issue for PLAs embedded in larger integrated circuits. An embedded PLA typically has very few nodes connected directly to an external test system, therefore the number of test vectors and the cost to test such a device is very large, to the point of being prohibitive. It is also true that each embedded use of a PLA typically has a different number and distributions of inputs and outputs accessible. It is a complex task to generate a set of test vectors of any length, which achieves a full stuck fault coverage. It would be a prohibitive cost to engineer a new set of test vectors for each application of an embedded PLA. Elements 27 and 23 of the described BIST system of FIG. 2 make it possible to test any embedded PLA with the same test flow, since the elements create a consistent and extensive input and output vector source independent of PLA to ASIC connections. These elements based on the principle of equation 1 substantially reduce the number of cycles and thus the complexity of the BIST flow. It is further true that, since all global interconnect lines running vertically and horizontally can be driven, this is much more then even the best combination of embedded input and output signals, as the number of internal interconnect lines is at least an order of magnitude more then the maximum number of inputs and outputs to a PLA.

The test of a PLA can be broken into three broad categories, as described previously above: These are Memory test, Interconnect testing, and Functional Element testing. The test of even a simple PLA is typically a long and complex process, which is very difficult to describe in complete detail. It is possible to describe the workings of the BIST system during a segment of operation in each of the three described test categories.

The test of the memory system requires showing the ability to write and read a logical 1 and 0 into each configuration memory bit. It is also necessary to prove that the nets and nodes of one do not interfere with the operation of others. The test used to do this is a walking 1 pattern. This is the programming of a single one in a field of zeros for each bit location of every memory word. It is also necessary to make all physically adjacent memory cells 0 while the bit under test is one. The reason for the walking one pattern is due to the nature of a PLA. Since every memory bit controls some programmable operation or interconnect, too many arbitrary bits programmed at a time might cause undesirable operation. BIST system performs an efficient memory test by:

1) Group Addressing is used to program a column of like function memory cells with the LSB bit of the CSRAM memory word 1 and other bits 0, 100. Using a GROUP Y Address and a singular X Address all cells in a column are programmed at the same time. Programming time is reduced reciprocally from having to program each individually. The value programmed into each memory cell word is that on the DATA bus word. The CONTROL signals are drive with the required protocol to do a memory cell program.

2) A read of the cells just programmed is done using the same group addressing. This read is different from a normal read since more then one cell is read at the same time. The read value from all the words can not be put onto the DATA lines as would normally be done in a memory read. Instead the value from each like cell words are stored in temporary registers in elements 21. The state of the temporary word registers are passed from element 21 to the compare elements 29 using buses BITY. All elements 21 pass a BITY bus signal to compare elements 29. Not all elements 21 have the results of a memory cell under test. The group addressing selected multiple but not necessarily all rows as active.

3) The same group address that was used to do a write, and then the read, is now used as a mask for the compare. The Compare element 29 has a BITY input which is the current value read from that row. Element 29 compares the current value of the row word BITY to the value of the last active word. The COMPARE output will indicate if all the BITY word values which where selected by active ADDY lines matched each other. It is possible to make the 2NDIN value 1 and drive the BITIN word with the same value used to drive the DATA word. This will make the COMPARE indicate that all selected rows match each other and the expected external standard value on the BITIN word.

At this point the BIST Control Engine would log the COMPARE value.

4) The DATA value is then incremented to 010 and steps 1 to 3 are repeated with the same group address.
5) The DATA value is then incremented to 001 and steps 1 to 3 are repeated with the same group address.
6) The DATA value is then incremented to 000 and steps 1 to 3 are repeated with the same group address.
7) The XADD values in incremented such that the next column of like cells is selected. Steps 1–6 are then repeated for the same group address.
8) The XADD value is incremented until all columns of memory have been tested with steps 1–6.
9) Steps 1–8 are repeated for each different group of like function memory words until all memory words have been test by steps 1–8.
10) The BIST Control Engine then checks the COMPARE value log generated in all step threes. If there are no mismatches indicated by a bit of the COMPARE word being 0 the memory is declared to have no stuck faults by the BIST system.

The test of the global interconnect lines and the PLA programmable interconnect structures can be represented by the test of typical programmable logic structure which would connect horizontally running PLA interconnect lines to vertically running PLA interconnect lines.

1) Group addressing is used to program a row of like function memory cells which enable a connection between a horizontal and vertical interconnect lines. This would make it possible for the 1$^{st}$ bit of the horizontal interconnect bus to drive the 1$^{st}$ bit of all vertical interconnect buses.
2) The FORCE control lines are used to enable the path that allows the value on the VECTOR bus to drive the value on the horizontal interconnect bus under test.
3) Apply a 100 value to the VECTOR bus.
4) Apply a YADD to elements 25 which enables the path between the vertical interconnect buses made active by the interconnects programmed in step 1. Apply a STROBE signal to sample the values and drive the result on the BITX lines.
5) Apply a group address which selects the elements 29 in all columns which have an active BITX word captured by step 4. Make the 2NDIN value 0. The COMPARE result will indicate that all the vertical interconnect busses have the same programmable connection made to the driven horizontal interconnect bus. At this point the BIST Control Engine logs the COMPARE value.
6) Apply a 010 value to the VECTOR bus, and repeat steps 4 and 5.
7) Apply a 001 value to the VECTOR bus, and repeat steps 4 and 5.
8) Apply a 000 value to the VECTOR bus, and repeat steps 4 and 5.
9) Apply a 011 value to the VECTOR bus, and repeat steps 4 and 5.
10) Apply a 101 value to the VECTOR bus, and repeat steps 4 and 5.
11) Apply a 110 value to the VECTOR bus, and repeat steps 4 and 5.
12) Apply a 111 value to the VECTOR bus, and repeat steps 4 and 5.
13) Reset the memory controlling the programmable interconnects enabled in step 1.
14) Increment the YADD and repeat steps 1–13 for the next row of programmable interconnects.
15) Repeat step 14 until all rows with like programmable interconnects have been tested.
16) The BIST Control Engine then checks the COMPARE value log generated in all step fives. If there are no mismatches indicated by a bit of the COMPARE word being 0, then all programmable interconnect paths and the horizontal and vertical interconnect lines used in steps 1 to 15 are declared to have no stuck faults by the BIST system.

Steps 1–16 need to be repeated for all the different types of programmable interconnect possible in the PLA architecture tested. It also needs to use each horizontal and vertical interconnect bus at least once in a test.

The test of the PLA programmable function units is very architecture specific. In a simple example of an architecture which has a function cell which could be 3 different 3 input functions, a NAND, an AND, and a NOR would work as follows:

1) Using group addressing efficiently as possible program a pattern of global vertical interconnect lines which systemically and uniformly connect the function cell input nodes to vertical interconnect busses such that the same bit of each vertical bus drives the same input of each function cell. Apply a FORCE input word which connects all the active vertical busses to the VECTOR bus.
2) Using a GROUP address program all the like function cells in a column defined by an XADD as a 3-input NAND gate with the output driving a global horizontal interconnect line in the function cells row.
3) Drive the VECTOR bus with a 000 value. This in turn drives all the vertical interconnect busses which will drive the function cell inputs.
4) Apply and XADD which connects the horizontal interconnect bus lines driven by the function cell output to the BIT lines.
5) Using a group address which selects the rows which have active functions cells under test, sample the BIT line value to generate a BITY word.
6) Using the same group address as step 5, do a sequential compare with the 2NDIN signal 0. At this point the BIST Control Engine would log the COMPARE value.
7) Drive VECTOR bus with a 001 value and repeat steps 4–6.
8) Drive VECTOR bus with a 010 value and repeat steps 4–6.
9) Drive VECTOR bus with a 011 value and repeat steps 4–6.
10) Drive VECTOR bus with a 100 value and repeat steps 4–6.
11) Drive VECTOR bus with a 101 value and repeat steps 4–6.
12) Drive VECTOR bus with a 110 value and repeat steps 4–6.
13) Drive VECTOR bus with a 111 value and repeat steps 4–6.
14) Reset the memory controlling the column of function cells programmed in step 1.
15) Increment the XADD and repeat steps 1–14 for the next column of function cells.
17) Repeat step 15 until all columns with similar function cells have been tested.

18) Repeat steps 1–17 with AND function operation programmed into all cells in Step 2.
19) Repeat steps 1–17 with NOR function operation programmed into all cells in Step 2.
20) The BIST Control Engine then checks the COMPARE value log generated in all step sixes. If there are no mismatches indicated by a bit of the COMPARE word being 0, then all function cell paths and the horizontal and vertical interconnect lines used in steps 1 to 17 are declared to have no stuck faults by the BIST system.

The structure and operation of a BIST system according to preferred embodiments of the present invention has been described in considerable detail and in several embodiments in an enabling fashion above. It will be apparent to the skilled artisan that there are many variations that might be made in the embodiments described without departing from the spirit and scope of the president mentioned. There are, for example, many different ways that the functional elements of the present invention might be implemented. The invention should be afforded the breadth of the claims which follow.

What is claimed is:

1. A self-testing programmable logic array (PLA) system, comprising:

an array of programmably interconnected logic cells;
a built-in self-test (BIST) structure interconnected with the logic cells; and
a BIST engine having an initiation input;
characterized in that, upon receiving the initiation input, the BIST engine drives the BIST structure to test memory of the logic cells, programmable interconnections between the logic cells, and functional logic of the logic cells of the self-testing PLA system and wherein the programmable logic cells of the array of programmable interconnected logic array includes logic cells arranged along lines and are addressed by an address line, the BIST structure including at least:
a sample line sampling outputs of programmable logic cells,
a vector line for sending an input vector to programmable logic cells,
a force line controlling whether the input vector is sent to the programmable logic cells, and
a plurality of compare blocks wherein each compare block is associated with a different one of the lines and comprises:
    an element for controlling the sample line and the force line;
    an element for address decoding that generates address line signals; and
    a compare element for comparing outputs of programmable logic cells.

2. The self-testing PLA system of claim 1, the compare block further comprises an element including program logic.

3. A self-testing programmable logic array (PLA) system, comprising:

an array of programmably interconnected logic cells;
a built-in self-test (BIST) structure interconnected with the logic cells; and
a BIST engine having an initiation input;
characterized in that, upon receiving the initiation input, the BIST engine drives the BIST structure to test memory of the logic cells, programmable interconnections between the logic cells, and functional logic of the logic cells of the self-testing PLA system wherein the programmable logic cells of the array of interconnected programmable logic cells having memory data, the self-testing PLA system further comprising:
an element including program logic;
a sample line for sampling outputs of the programmable logic cells;
a vector line for sending an input vector to programmable logic cells;
a force line controlling whether the input vector is sent to the programmable logic cells; and
an element for controlling the sample line and controlling the force line.

4. The self-testing PLA system of claim 3 further comprising a bit line connecting the programmable logic cell to the elements including program logic and to the elements for controlling the sample line and controlling the force line.

5. The self-testing PLA system of claim 3 further comprising a global line that interconnect the programmable logic cells to perform a logical function and connect the programmable logic cells to the element for controlling the sample line and controlling the force line, the global line is driven by he vector signal.

6. The self-testing PLA system of claim 3 further comprising an address lines connecting the element for address decoding to the element controlling a sample line and controlling a force line.

7. A self-testing programmable logic array (PLA) system, comprising:

an array of programmably interconnected logic cells;
a built-in self-test (BIST) structure interconnected with the logic cells; and
a BIST engine having an initiation input;
characterized in that, upon receiving the initiation input, the BIST engine drives the BIST structure to test memory of the logic cells, programmable interconnections between the logic cells, and functional logic of the logic cells of the self-testing PLA system wherein each programmable logic cell of the array of interconnected programmable logic cells comprises:
circuitry for performing logic functions;
memory cells for controlling the configuration of the circuitry for performing logic functions;
an input for decoding signals from x and y address lines;
an input for a global x line;
an input for a global y line; and
an input for a bit line for writing to the memory cells.

* * * * *

UNITED STATES PATENT AND TRADEMARK OFFICE
CERTIFICATE OF CORRECTION

| | |
|---|---|
| PATENT NO. | : 6,874,110 B1 |
| APPLICATION NO. | : 09/569741 |
| DATED | : March 29, 2005 |
| INVENTOR(S) | : Rafael C. Camarota |

It is certified that error appears in the above-identified patent and that said Letters Patent is hereby corrected as shown below:

Title Page
In Section (75) on the face of the issued patent, "Rafel C. Camarota, Sunnyvale, CA (US)" should read -- Rafael C. Camarota, Sunnyvale, CA (US) --

Signed and Sealed this

Twentieth Day of March, 2007

JON W. DUDAS
*Director of the United States Patent and Trademark Office*